United States Patent
Argentati et al.

(10) Patent No.: US 6,412,093 B1
(45) Date of Patent: Jun. 25, 2002

(54) CONTROL DATA LINK FORMAT UTILIZING CRC ERROR DETECTION

(75) Inventors: Merico Edward Argentati, Englewood; James R. Bortolini, Broomfield, both of CO (US); Fernand Da Fonseca, Morangis (FR); Scott E. Farleigh, Denver, CO (US); David John Hudak, Boulder, CO (US); Floyd Craig Wolverton, Westminster, CO (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/474,321

(22) Filed: Dec. 29, 1999

(51) Int. Cl.[7] .............................................. H03M 13/09
(52) U.S. Cl. ..................................................... 714/807
(58) Field of Search ......................................... 714/807

(56) References Cited

U.S. PATENT DOCUMENTS 4,309,721 A * 1/1982 Christopher ............. 369/47.55
4,910,736 A * 3/1990 Tanaka et al. ............... 714/758

* cited by examiner

Primary Examiner—Stephen M. Baker
(74) Attorney, Agent, or Firm—John C. Moran

(57) ABSTRACT

Control data is communicated utilizing a multi-frame format that consists of individual frames each having a number of rows and columns. As each row is received from a transmitting unit, the data and position of the row within a frame is verified by use of a checksum and is immediately utilized by the receiving unit. This reduces the amount of storage that must be provided by the receiving unit for the reception of control information to that of a single row. In addition to verifying the row identification, the identity of each frame within the multi-frame is also verified before an individual row is utilized. In a first embodiment, the operation of generating the checksum is seeded with the current row number. In a second embodiment, the operation of generating the checksum is seeded with the result of an Exclusive OR operation of the current row number and frame number.

12 Claims, 6 Drawing Sheets

CONTROL DATA LINK FORMAT UTILIZING CRC ERROR DETECTION

TECHNICAL FIELD

This invention relates to communication switching, and in particular, to the synchronization of the transmission of control information.

BACKGROUND OF THE INVENTION communications systems, it is often necessary to exchange control information between a central control unit and distributed units. In general, there are two main methods of performing this exchange of control information. The first method is to utilize a controller, normally a computer, in the central control unit and in each of the distributed control units. When the main control unit needs to modify the control information being utilized in a distributed unit, the computer in the main control unit simply sends the changes in the control information to the distributed unit. A computer in the distributed unit then properly modifies control tables with the changed information. The problem with this technique is in the reliability of software that is utilized to control the computers. Software problems can cause significant problems within the communications system.

The second method is often referred to as synchronous control. In the synchronous control method, the main controller continuously retransmits all of the control information to the distributed units. The interval at which the information is repeated is referred to as the frame interval. Synchronous control is utilized in certain telecommunications systems. In addition, certain television systems transmit textual information to television sets as Teletext using synchronous control. The distributed units also use synchronized control to communicate their control information to the main controller. Synchronous control has many advantages one of which is the fact that data being distributed among the distributed units is also being transmitted on the basis of the frame interval. Thus, the required timing signals are already available. Synchronous control does have a serious problem. Within synchronous control, the value of the control data, as well as its precise position within the frame, determines how the data will affect the unit receiving this control information. The problem occurs when timing or data errors affect the content of a frame. To prevent these problems, error-checking protocols are utilized over the entire content of the frame to assure that the frame has been correctly received by the receiving unit before the receiving unit utilizes the control information contained in the frame. The problem with this prior art solution is that in telecommunications systems the amount of data contained in each individual frame may be large resulting in a large amount of storage being necessary to allow the complete checking of the frame before its utilization.

SUMMARY OF THE INVENTION

The foregoing problems are solved, and a technical advance is achieved, by an apparatus and method in which control data is communicated utilizing a multi-frame format that consists of individual frames each having a number of rows and columns. As each row is received from a transmitting unit, the data and position of the row within a frame is verified by use of a checksum and is immediately utilized by the receiving unit. Advantageously, this reduces the amount of storage that must be provided by the receiving unit for the reception of control information to that of a single row. In addition to verifying the row identification, the identity of each frame within the multi-frame is also verified before an individual row is utilized. Advantageously, in a first embodiment of the invention, the operation of generating the checksum is seeded with the current row number. Advantageously, in a second embodiment of the invention, the operation of generating the checksum is seeded with the result of an Exclusive OR operation of the current row number and frame number. Advantageously, the multi-frame protocol used for the communication of control information is similar to the STM protocol.

Other and further aspects of the present invention will become apparent during the course of the following description by reference to the accompanying drawing.

DETAILED DESCRIPTION

Figure 1:
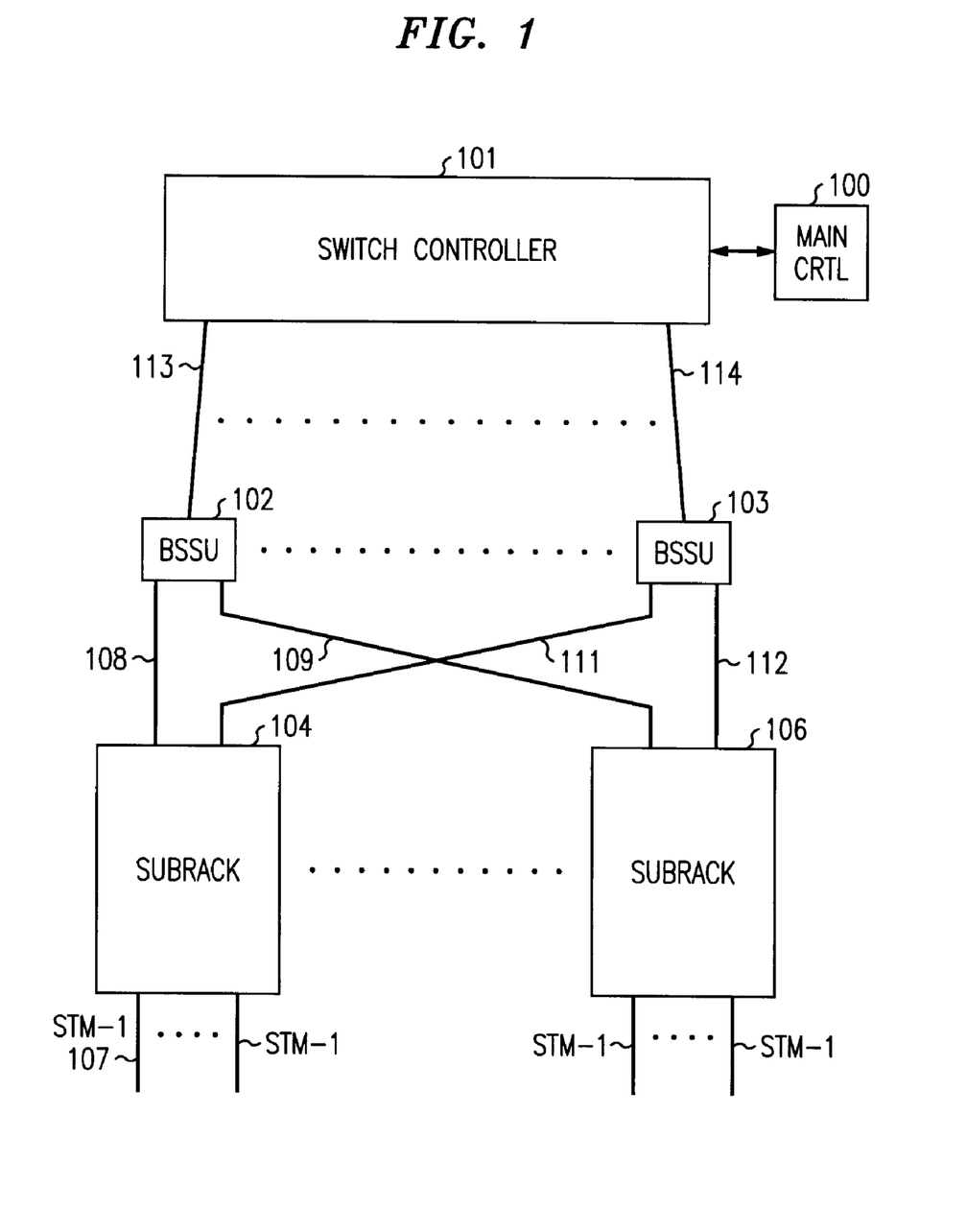
FIG. 1 illustrates, in block diagram form, a telecommunication switching system for use with the invention.

FIG. 1 illustrates, in block diagram form, a telecommunication switching system for utilizing the invention. Switch controller 101 in response to information received from controller 100 controls the overall operation of the switching system illustrated in FIG. 1. The switching of data is performed by bits slice switching units (BSSUs) 102 through 103. There are illustratively 10 BSSUs. Each active BSSU switches one bit of each byte of each of the external links such as STM-1 link 107. Advantageously, link 107 and other external links are STM-1 links. Further information on the overall operation of blocks 100–106 is set forth in U.S. patent application Ser. No. 08/921,677 filed on Aug. 29, 1997 and assigned to the same assignee as the present patent application and hereby incorporated by reference.

Figure 2:
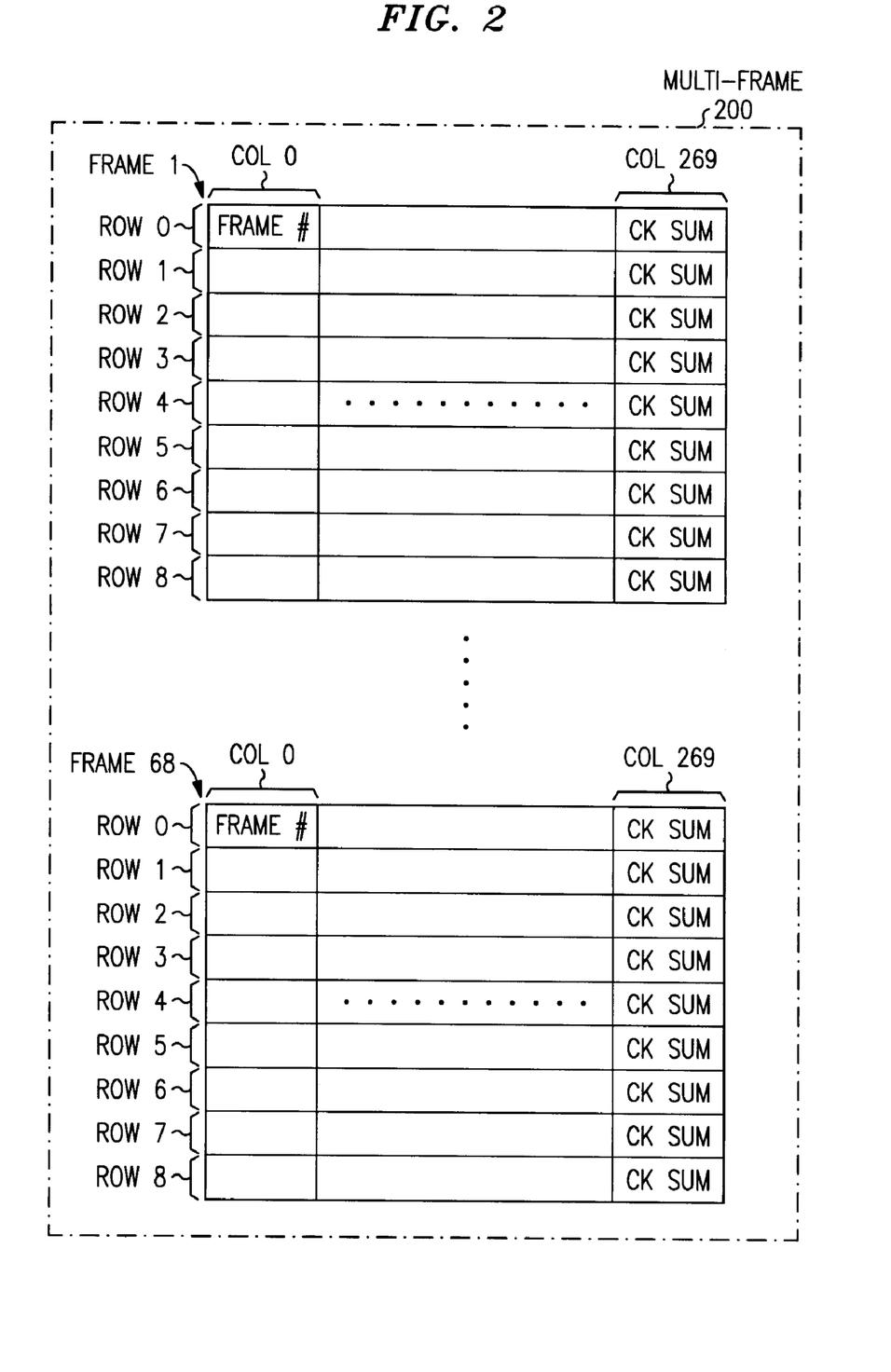
FIG. 2 illustrates, in table form, a multi-frame.

Control information is transmitted between switch controller 101, BSSUs 102–103, and subracks of 104–106 utilizing multi-frames that use a protocol similar to the STM protocol with respect to the number of columns, rows, and frames within a multi-frame. FIG. 2 illustrates multi-frame 200. Multi-frame 200 consists of 68 frames with each frame having 9 rows and 270 columns. The last column of each row contains the CRC check sum for the data contained in that row. In addition, column 0 of row 0 of each frame contains the frame number of that frame. A multi-frame requires 8.5 milliseconds for transmission with each frame requiring 125 microseconds. With the exception of the utilization of columns 0 and 269, the remaining data capacity of the rows is utilized to transport control information from switch controller 101 to a BSSU such as BSSU 102. In addition, although not described, control information is transferred from a BSSU to a subrack utilizing the same multi-frame information. Also, control information is transferred from subracks and BSSUs to switch controller 101 utilizing the same multi-frame format.

In a first embodiment of the invention, the check sum is formed for each row by initializing (seeding) the CRC circuit with the row number and then generating the CRC check sum which is then inserted into the last column in the row before transmission. When a receiving circuit starts to receive each row, the receiving circuits also seeds its CRC generator utilizing the expected row number. If the transmitted CRC number and the CRC number calculated by the receiver are in agreement at the receiver, the receiver then immediately utilizes that row of data. If an error occurs, then no action is taken until the start of the next multi-frame. In a second embodiment of the invention, the check sum is formed for each row by initializing (seeding) the CRC circuit with the result of the Exclusive OR (XOR) operation of the frame number and row number and then generating the CRC check sum which is then inserted into the last column in the row before transmission. When a receiving circuit starts to receive each row, the receiving circuits also seeds its CRC generator utilizing the result of the XOR of the expected row number and a transmitted frame number. If the transmitted CRC number and the CRC number calculated by the receiver are in agreement at the receiver, the receiver then immediately utilizes that row of data. If an error occurs, then no action is taken until the start of the next multi-frame.

Figure 3:
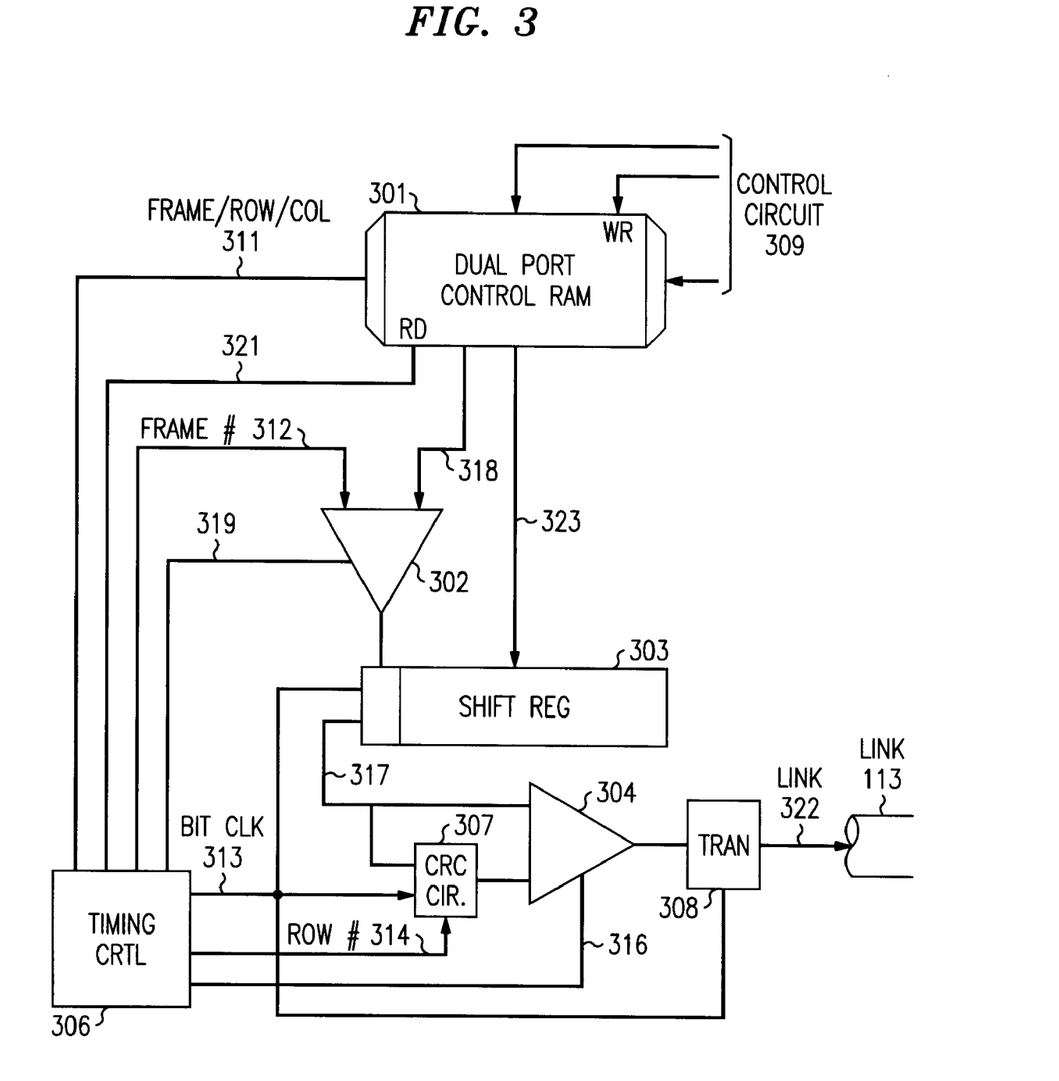
FIG. 3 illustrates, in block diagram form, a transmission unit in accordance with a first embodiment of the invention.
Figure 4:
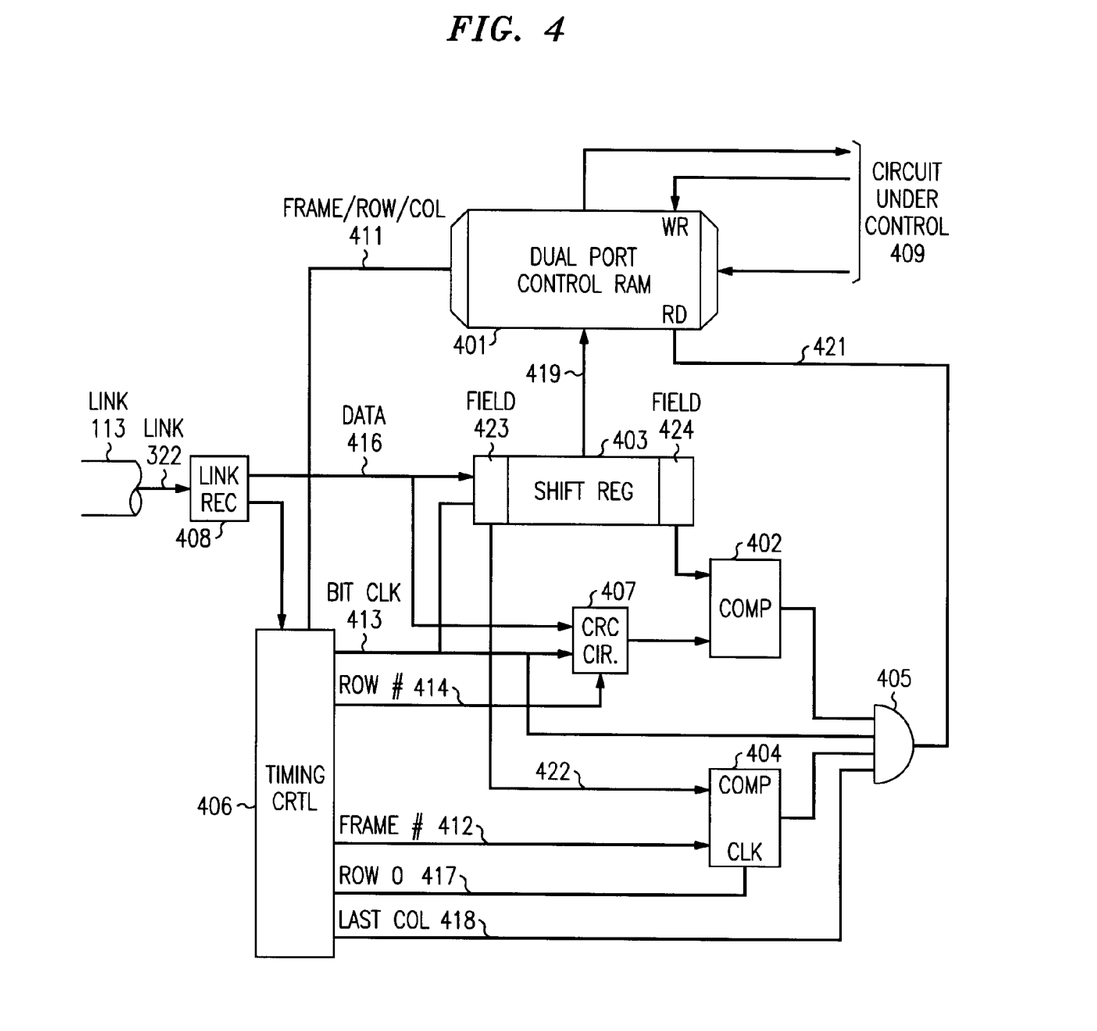
FIG. 4 illustrates, in block diagram form, a receiving unit in accordance with a first embodiment of the invention.

Consider now the first embodiment of the invention. FIG. 3 illustrates, in block diagram form, the portion of switch controller 101 that is utilized to transmit control information to BSSU 102. The information to be transmitted is loaded by control circuit 309 which is part of switch controller 101 into dual port control RAM 301 in the proper multi-frame format. The information is then extracted, row by row, and transmitted serially via link 322 to a receiver circuit in BSSU 102 which is illustrated in FIG. 4. Timing controller 306 extracts the proper row of information by generating the frame, row, and column information that is utilized as an address to dual port control RAM 301. Each row from RAM 301 is inserted into shift register 303. If it is row 0, timing control 306 selects the frame number on conductor 312 to be inserted into the first byte of shift register 303 by controlling multiplexer 302 via conductor 319. Next, timing controller 306 seeds CRC circuit 307 with the correct row number via row number signal on conductor 314. The shift register 303 and CRC circuit 307 are then clocked by the bit clock signal on 313. The bit clock signal causes the contents of shift register 303 to be transmitted via conductor 317 to CRC circuit 307 and multiplexer 304. CRC circuit 307 is responsive to the data from shift register 303 to calculate the CRC check sum for the data contained in shift register 303. Multiplexer 304 is responsive to the data from shift register 303 under control of a signal transmitted on conductor 316 from timing controller 306 to transfer the data to transmitter 308. Initially, multiplexer 304 is controlled by the signal on conductor 316 to accept the output of shift register 303 received via conductor 317 for transmission by transmitter 308 on link 322. (Link 322 is part of link 113 of FIG. 1.) When the final column of the row is reached, the signal on conductor 316 selects the output of CRC circuit 307 and enables CRC circuit 307 to serially transfer the calculated CRC check sum via multiplexer 304 to link 322 via transmitter 308. Both the clock and control information are present on link 322. The clock information is included on the link so that the receiving circuit illustrated in FIG. 4 can extract the bit, frame and multi-frame timing.

FIG. 4 illustrates, in block diagram form, a receiver in BSSU 102 for receiving control information being transmitted from the transmitter of FIG. 3 via link 322. The circuitry illustrated in FIG. 4 and Circuit Under Control 409 could be advantageously the part of circuits 216 and 224 of FIG. 2 of the above-incorporated U.S. patent application.

Link receiver 408 is responsive to information received on link 322 to recover timing for timing controller 406 and to transfer the received data via conductor 416 to shift register 403. Shift register 403 is clocked by timing controller 406 via the bit clock signal that is transmitted on conductor 413. The data is also clocked into CRC circuit 407 which had been properly seeded with the expected row number via conductor 414 from timing controller 406. The receiver of FIG. 4 verifies that the frame expected by timing controller 406 is the same as the frame number in the first column of the first row of the frame. In addition, the circuit verifies that the resulting CRC check sum generated by CRC circuit 407 is identical to the CRC check sum inserted by the transmitter of FIG. 3 into the last column of each row. If the frame number and the row number are correct, the data portion of shift register 403 is transferred to dual port control RAM 401 under the write control generated by AND gate 405 via conductor 421.

Consider now how the frame and row are verified. After an entire row has been shifted into shift register 403 from link receiver 408, the CRC sum generated by CRC circuit 407 is compared with the transmitted CRC sum which is contained in field 424 by comparator 402. If the comparison is true, comparator 402 enables its input of AND gate 405. Timing controller 406 signifies that the row is in shift register 403 by making the last column signal true on conductor 418 thus enabling another input of AND gate 405. If the row is row 0, timing controller 406 indicates this fact via a signal on conductor 417. This signal latches in comparator 404 the results of the comparison of the current expected frame number transmitted on path 412 to comparator 404 from timing controller 406 and the contents of field 423 which is the frame number transmitted from the transmitter. If the answer is that these two frame numbers are equal, comparator 404 maintains a true signal to AND gate 405 for the remainder of the frame. If all of the inputs are true, the next bit time on conductor 413 generates a write pulse which transfers the contents of shift register 403 via path 419 into dual port control RAM 401 with the correct address being transmitted by timing controller 406 via path 411 to RAM 401.

Circuit Under Control 409 accesses the control information from dual port control RAM 401 by generating the proper frame, row, and column information.

Figure 5:
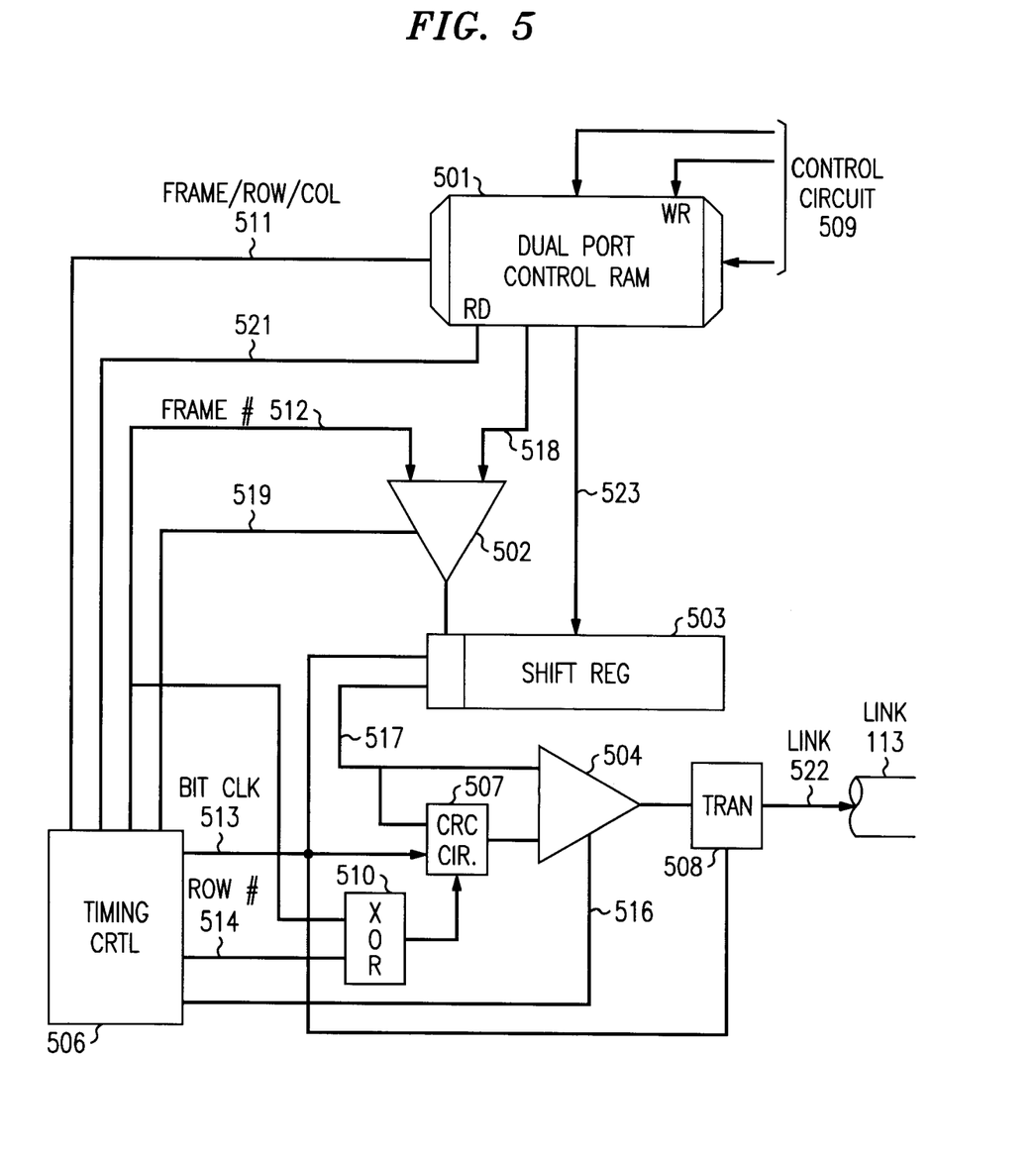
FIG. 5 illustrates, in block diagram form, a transmission unit in accordance with a second embodiment of the invention.
Figure 6:
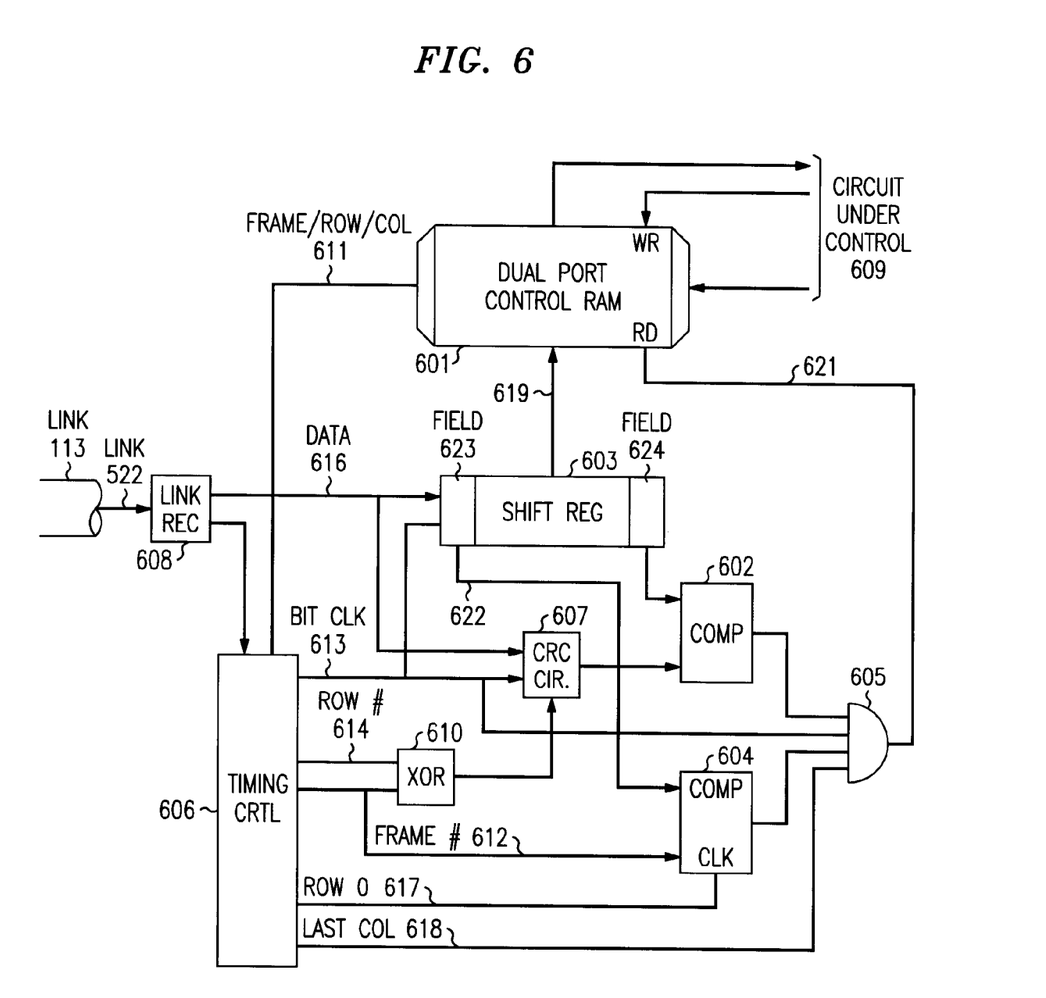
FIG. 6 illustrates, in block diagram form, a receiving unit in accordance with a second embodiment of the invention.

Consider now the second embodiment of the invention. FIG. 5 illustrates, in block diagram form, the portion of switch controller 101 that is utilized to transmit control information to BSSU 102. The information to be transmitted is loaded by control circuit 509 which is part of switch controller 101 into dual port control RAM 501 in the proper multi-frame format. The information is then extracted, row by row, and transmitted serially via link 522 to a receiver circuit in BSSU 102 which is illustrated in FIG. 6. Timing controller 506 extracts the proper row of information by generating the frame, row, and column information that is utilized as an address to dual port control RAM 501. Each row from RAM 501 is inserted into shift register 503. If it is row 0, timing control 506 selects the frame number on conductor 512 to be inserted into the first byte of shift register 503 by controlling multiplexer 502 via conductor 519. Next, timing controller 506 seeds CRC circuit 507 with the XOR of the correct row number via row number signal on conductor 514 and the current frame number via the frame number signal on conductor 512 with the actual XOR operation being performed by XOR 510. The shift register 503 and CRC circuit 507 are then clocked by the bit clock signal on 513. The bit clock signal causes the contents of shift register 503 to be transmitted via conductor 517 to CRC circuit 507 and multiplexer 504. CRC circuit 507 is responsive to the data from shift register 503 to calculate the CRC check sum for the data contained in shift register 503. Multiplexer 504 is responsive to the data from shift register 503 under control of a signal transmitted on conductor 516 from timing controller 506 to transfer the data to transmitter 508. Initially, multiplexer 504 is controlled by the signal on conductor 516 to accept the output of shift register 503 received via conductor 517 for transmission by transmitter 508 on link 522. (Link 522 is part of link 113 of FIG. 1.) When the final column of the row is reached, the signal on conductor 516 selects the output of CRC circuit 507 and enables CRC circuit 507 to serially transfer the calculated CRC check sum via multiplexer 504 to link 522 via transmitter 508. Both the clock and control information are present on link 522. The clock information is included on the link so that the receiving circuit illustrated in FIG. 6 can extract the bit, frame and multi-frame timing.

FIG. 6 illustrates, in block diagram form, a receiver in BSSU 102 for receiving control information being transmitted from the transmitter of FIG. 5 via link 522. The circuitry illustrated in FIG. 6 and Circuit Under Control 609 could be advantageously the part of circuits 216 and 224 of FIG. 2 of the above-incorporated U.S. patent application.

Link receiver 608 is responsive to information received on link 522 to recover timing for timing controller 606 and to transfer the received data via conductor 616 to shift register 603. Shift register 603 is clocked by timing controller 606 via the bit clock signal that is transmitted on conductor 613. The data is also clocked into CRC circuit 607 which had been properly seeded with the XOR of the expected row number and the current frame number performed by XOR 610. XOR 610 is responsive to the expected row number via conductor 614 and the current frame number via conductor 612 from timing controller 606. The receiver of FIG. 6 verifies that the frame expected by timing controller 606 is the same as the frame number in the first column of the first row of the frame. In addition, the circuit verifies that the resulting CRC check sum generated by CRC circuit 607 is identical to the CRC check sum inserted by the transmitter of FIG. 5 into the last column of each row. If the frame number and the row number are correct, the data portion of shift register 603 is transferred to dual port control RAM 601 under the write control generated by AND gate 605 via conductor 621.

Consider now how the frame and row are verified. After and entire row has been shifted into shift register 603 from link receiver 608, the CRC sum generated by CRC circuit 607 is compared with the transmitted CRC sum which is contained in field 624 by comparator 602. If the comparison is true, comparator 602 enables its input of AND gate 605. Timing controller 606 signifies that the row is in shift register 603 by making the last column signal true on conductor 618 thus enabling another input of AND gate 605. If the row is row 0, timing controller 606 indicates this fact via a signal on conductor 617. This signal latches in comparator 604 the results of the comparison of the current expected frame number transmitted on path 612 to comparator 604 from timing controller 606 and the contents of field 623 which is the frame number transmitted from the transmitter. If the answer is that these two frame numbers are equal, comparator 604 maintains a true signal to AND gate 605 for the remainder of the frame. If all of the inputs are true, the next bit time on conductor 613 generates a write pulse which transfers the contents of shift register 603 via path 619 into dual port control RAM 601 with the correct address being transmitted by timing controller 606 via path 611 to RAM 601.

Circuit Under Control 609 accesses the control information from dual port control RAM 601 by generating the proper frame, row, and column information.

Of course, various changes and modifications to the illustrative embodiment described above will be apparent to those skilled in the art. Such changes and modifications can be made without departing from the spirit and scope of the invention and without diminishing its intended advantages. It is therefore intended that such changes and modifications be covered by the following claims.

What is claimed is:

1. A method for verifying control information transmitted from a transmitting control unit to a receiving control unit as a control multi-frame with the control multi-frame including control frames, rows and columns, comprising the steps of:

storing a control multi-frame in the transmitting control unit;

accessing a row of a current control frame of the control multi-frame;

generating a check sum for data of the accessed row with a starting seed for the check sum being a row number defining the position of the row in the current control frame of the control multi-frame;

inserting the generated check sum into the accessed row;

transmitting the accessed row;

receiving the accessed row by the receiving control unit;

calculating a check sum for the data of the received row by receiving control unit with a starting seed for the check sum being an expected row number defining the position of the row in a current control frame;

comparing the received check sum and the calculated check sum by the receiving control unit; and using by the receiving control unit the control information in the row immediately upon the received check sum being equal to the calculated check sum.

2. The method of claim 1 wherein each received frame includes a designated row that has a column containing a frame number of that frame and the method further comprises the step of generating an expected frame number by the receiving control unit; and the step of using comprises the step of comparing the frame number of the received frame contained in the designated row with the expected frame number and allowing use of the control information of that frame upon the frame number of the received frame contained in the designated row equaling the expected frame number.

3. The method of claim 2 wherein the check sum is a CRC check sum.

4. A method for verifying control information transmitted from a transmitting control unit to a receiving control unit as a control multi-frame with the control multi-frame including control frames, rows and columns, comprising the steps of:

storing a control multi-frame in the transmitting control unit;

accessing a row of a current control frame of the control multi-frame;

exclusive or'ing a row number defining the position of the row in the current control frame and a current frame number of the current control frame;

generating a check sum for data of the accessed row with the starting seed for the check sum being the result of the step of exclusive or'ing;

inserting the generated check sum into the accessed row;

transmitting the accessed row;

receiving the accessed row by the receiving control unit;

exclusive or'ing an expected row number for the current control frame row and an expected frame number for the current control frame being received;

calculating a check sum for the data of the received row by receiving control unit using the result of the step of exclusive or'ing as the seed;

comparing the received check sum and the calculated check sum by the receiving control unit; and using by the receiving control unit the control information in the row immediately upon the received check sum being equal to the calculated check sum.

5. The method of claim 4 wherein each received frame includes a designated row that has a column containing a frame number of that frame and wherein the step of using comprises the step of comparing the frame number of the received frame contained in the designated row with the expected frame number and allowing use of the control information of that frame upon the frame number of the received frame contained in the designated row equaling the expected frame number.

6. The method of claim 5 wherein the check sum is a CRC check sum.

7. An apparatus for verifying control information transmitted from a transmitting control unit to a receiving control unit as a control multi-frame with the control multi-frame including control frames, rows and columns, comprising:

a memory in the transmitting control unit storing a control multi-frame;

a transmit controller in the transmitting control unit accessing a row of a current frame of the current frame of the control multi-frame;

a first check sum circuit in the transmitting control unit generating a check sum for data of the accessed row with a starting seed for the check sum being a row number defining the position of the row in the control multi-frame;

the transmit controller responsive to the generated check sum for inserting the generated check sum into the accessed row;

a transmitter in the transmitting control unit transmitting the accessed row;

a receiver in the receiving control unit receiving the accessed row;

a second check sum circuit in the receiving control unit calculating a check sum for the data of the received row with a starting seed for the check sum being an expected row number defining the position of the row in the current control frame;

a comparator in the receiving control unit comparing the received check sum and the calculated check sum; and a receive controller in the receiving control unit using the control information in the row immediately upon the received check sum being equal to the calculated check sum as determined by the comparator.

8. The apparatus of claim 7 wherein each received frame includes a designated row that has a column containing a frame number of that frame and the receive controller further generating an expected frame number; and the receive controller further comparing the frame number of the received frame contained in the designated row with the expected frame number and using of the control information of that frame upon the frame number of the received frame contained in the designated row equaling the expected frame number.

9. The apparatus of claim 8 wherein the check sum is a CRC check sum.

10. An apparatus for verifying control information transmitted from a transmitting control unit to a receiving control unit as a control multi-frame with the control multi-frame including control frames, rows and columns, comprising:

a memory in the transmitting control unit storing a control multi-frame;

a transmit controller in the transmitting control unit accessing a row of a current control frame of the control multi-frame;

a first exclusive or circuit in the transmitting control unit exclusive or'ing a row number defining the position of the row in the current control frame and a current frame number of the current control frame;

a first check sum circuit in the transmitting control unit generating a check sum for data of the accessed row with a starting seed for the check sum being the result from the exclusive or circuit;

the transmit controller responsive to the generated check sum for inserting the generated check sum into the accessed row;

a transmitter in the transmitting control unit transmitting the accessed row;

a receiver in the receiving control unit receiving the accessed row;

a second exclusive or circuit in the receiving control unit exclusive or'ing an expected row number for the current control frame row and an expected frame number for the current control frame being received;

a second check sum circuit in the receiving control unit calculating a check sum for the data of the received row using the result from the exclusive or circuit as a seed;

a comparator in the receiving control unit comparing the received check sum and the calculated check sum; and a receive controller in the receiving control unit using the control information in the row immediately upon the received check sum being equal to the calculated check sum.

11. The apparatus of claim 10 wherein each received frame includes a designated row that has a column containing a frame number of that frame and wherein the receive controller further comparing the frame number of the received frame contained in the designated row with the expected frame number and using of the control information of that frame upon the frame number of the received frame contained in the designated row equaling the expected frame number.

12. The apparatus of claim 11 wherein the check sum is a CRC check sum.

* * * * *